(12) United States Patent
Gerfers et al.

(10) Patent No.: US 7,728,754 B2
(45) Date of Patent: Jun. 1, 2010

(54) INTEGRATING ANALOG TO DIGITAL CONVERTER

(75) Inventors: Friedel Gerfers, Duisburg (DE); Wolfgang Furtner, Fuerstenfeldbruck (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/092,859

(22) PCT Filed: Nov. 8, 2006

(86) PCT No.: PCT/IB2006/054164

§ 371 (c)(1), (2), (4) Date: May 7, 2008

(87) PCT Pub. No.: WO2007/054902

PCT Pub. Date: May 18, 2007

(65) Prior Publication Data

US 2008/0252507 A1    Oct. 16, 2008

(30) Foreign Application Priority Data

Nov. 11, 2005    (EP) .................. 05110666
Nov. 8, 2006    (WO) .................. PCT/IB2006/054164

(51) Int. Cl.
*H03M 1/50*    (2006.01)
(52) U.S. Cl. .................. 341/166; 341/155; 341/156
(58) Field of Classification Search .................. 341/155, 341/166, 156; 326/39
See application file for complete search history.

(56) References Cited

U.S. PATENT DOCUMENTS 6,292,016 B1 * 9/2001 Jefferson et al. .............. 326/39
6,657,456 B1 * 12/2003 Jefferson et al. .............. 326/39
2005/0057388 A1    3/2005 Terazawa et al.
2005/0062482 A1    3/2005 Vincent et al.
2005/0140422 A1    6/2005 Klemmer

OTHER PUBLICATIONS

Cura, J. L; et al "A Novel 12-Bit, 3 /SPL MU/S, Integrating-Type CMOS Analog-To-Digital Converter" Proceedings. XI Brazilian Symposium on Integrated Circuit Design, 1998. Sep. 30, 1998, pp. 74-77.

Farjad-Rad, Ramin; et al "A Low-Power Multiplying DLL for Low-Jitter Multigigahertz Clock Generation in Highly Integrated Digital Chips" IEEE Journal of Solid-State Circuits, vol. 37, No. 12, Dec. 2002, pp. 1804-1812.

Savoj, J; et al "A CMOS Interface Circuit for Detection of 1.2 GB/S RZ Data" International Conference of Solid-State Circuit. Digest of Techincal Papers. ISSCC. Feb. 15, 1999, pp. 278-279.

* cited by examiner

*Primary Examiner*—Jean B Jeanglaude

(57) ABSTRACT

An integrating analog to digital converter (ADC) is disclosed that comprises a Delay Locked Loop (DLL) (2, 50) which is synchronized to a reference clock signal (12). A rising edge of a clock signal therefore propagates through the DLL once each clock cycle. In use, the integrating ADC converts an analog input signal to a digital output signal dependent upon a timing measurement of an integration carried out by an integrator (4). The timing measurement is taken by reading the logical states of the individual delay cells in the DLL. This enables the position of the rising edges of the clock signal to be determined and used as a timing measurement. The timing measurement is in the form of a digital thermometer code that can be converted into a binary number.

15 Claims, 4 Drawing Sheets

INTEGRATING ANALOG TO DIGITAL CONVERTER

The present invention relates to analog to digital converters (ADCs) and in particular to ADCs in which the conversion from analog to digital is achieved by timing an integration of a signal. It also relates to a method of converting an analog signal into a digital signal.

Many applications require the conversion of a continuous, analog signal into a discrete digital signal. Design of an ADC usually involves a trade off between resolution (the number of discrete levels contained in the digitized signal) and speed (the number of samples which can be taken each second).

Integrating ADCs are known. These can achieve a high resolution by timing an integration of a signal to reach a reference level. The time taken is proportional to the amplitude of the signal that is to be converted to a digital signal. Integrating ADCs require a high precision timing reference that operates at a frequency that is as many times higher than the sampling rate as there are levels in the output signal. For example, a 5-bit output signal would have 32 levels and require a timing reference at a frequency 32 times the sampling rate.

It has also been proposed to design an ADC around digital delay lines. US2005/0062482 A1 discusses one such ADC topology. The analog signal to be converted is applied as a supply voltage to a delay line that comprises a plurality of delay cells connected in series. The signal propagation through the delay line varies substantially proportionately with the supply voltage. At the beginning of each switching cycle a pulse is applied to the start of the delay line. After a fixed time interval the propagation of this pulse along the delay line can be measured. As the delay varies in proportion to the supply voltage, the propagation of the pulse will be proportional to the analog signal voltage.

Delay cells are relatively simple to implement in an IC, reducing the cost of producing an ADC. However, process and temperature variations introduce variations into the operation of the delay line that can affect the accuracy of the output.

It is therefore an object of the present invention to provide an ADC in which the effect of process and temperature variations on the accuracy of an ADC is reduced.

In accordance with a first aspect of the present invention, there is provided an integrating analog to digital converter (ADC) for converting an analog input signal into a digital output signal, the integrating ADC comprising:

signal generation means for generating a reference clock signal having a frequency equal to or greater than the sampling frequency;

a delay locked loop comprising a delay line comprising a plurality of delay cells, wherein the delay locked loop is locked to the reference clock signal;

integration means for integrating a first signal; and digital logic means for generating the digital output signal from a timing measurement of an integration carried out by the integration means, and wherein the timing measurement is at least partially determined from the logical state of the plurality of delay cells.

The signal generation means may be any circuit that can generate an oscillating signal, for example a Phase-Locked Loop (PLL) or a crystal oscillator. The integration means may be any circuit that has an output representing the integral of its input, for example an operational amplifier circuit. The digital logic means may be any circuit including digital logic circuit elements, such as logic gates and flip flops.

The present invention uses a Delay Locked Loop (DLL) that is locked to the reference clock signal. The reference clock signal therefore propagates through the DLL once every clock cycle. The propagation of the clock signal through the delay line can then be used to carry out a timing measurement within each clock cycle. The DLL is a closed loop system; the action of the feedback adjusts the supply voltage of the individual delay cells to ensure that the DLL remains locked to, and synchronized with, the reference clock signal. This reduces the effect of process and temperature variations.

The general operating principles of integrating ADCs are known as acknowledged above. Typically, an integration is carried out and the time for the integration to reach a predetermined value is measured. However, by using a delay locked loop for the timing measurement, the present invention enables an accurate timing measurement that is less affected by temperature and process variations. A further advantage is that the delay cells comprised in the DLL are basic building blocks used in many digital circuits and can be driven at a high switching speed, 1 GHz or higher, to enable both a good resolution and a good sampling rate to be obtained. Another advantage is that the ADC has relatively low power consumption requirements, making it suitable for all applications. A still further advantage is that the DLL can be implemented in a relatively small area of silicon minimizing production cost.

The DLL may be a multiplying DLL (MDLL) as defined in claim 4. This allows the DLL to be implemented using fewer delay cells which reduces the amount of jitter. It also has the further advantage of reducing the required switching speed of the delay cells compared to the operation frequency of the counter circuit required in an integrating ADC which does not use a DLL.

According to a second aspect of the present invention, there is provided an integrating analog to digital converter (ADC) for converting an analog input signal into a digital output signal, the integrating ADC comprising:

signal generation means for generating a sampling clock signal having a sampling frequency;

a ring oscillator comprising a delay line comprising a plurality of delay cells, wherein the ring oscillator is for generating an oscillation signal having an oscillation frequency equal to or greater than the sampling frequency;

integration means for integrating a first signal;

calibration means for calibrating the oscillation frequency of the ring oscillator with the sampling frequency or a reference frequency by determining the number of delay cells through which an edge of the oscillation signal passes in a sampling period; and digital logic means for generating the digital output signal from a timing measurement of an integration carried out by the integration means, and wherein the timing measurement is at least partially determined from the logical state of the plurality of delay cells.

The signal generation means may be any circuit that can generate an oscillating signal, for example a Phase-Locked Loop (PLL) or a crystal oscillator. The integration means may be any circuit that has an output representing the integral of its input, for example an operational amplifier circuit. The digital logic means may be any circuit including digital logic circuit elements, such as logic gates and flip flops. The calibration means may be any circuit which can calibrate the oscillation frequency of the ring oscillator with the sampling frequency. The edge of the oscillation signal that is used by the calibration means may be either a rising or a falling edge.

As with the first aspect, a delay line is used for a timing measurement, however it is contained within a ring oscillator rather than a DLL. The ring oscillator will be subject to process and temperature variations, however the calibration means compensates for these process and temperature variations in a relatively simple way by calibrating the oscillation frequency with the sampling frequency. In common with the first aspect, the use of a delay line for a timing measurement allows process and temperature variations to be compensated in an effective way. This aspect shares the advantages of first aspect in that the delay cells comprised in the ring oscillator are basic building blocks used in many digital circuits and can be driven at a high switching speed, 1 GHz or higher, to enable both a good resolution and a good sampling rate to be obtained. The ADC of this aspect also has relatively low power consumption requirements and can be implemented in a relatively small area of silicon minimizing production cost.

The comparison means, as defined in appended claim 6, may be any suitable circuit which can compare one signal with another. The comparison means allows the output of the integration means to be compared to a second signal and ensure that the timing measurement is taken at the correct time. The second signal may be the analog input signal and the first signal may be a reference voltage or current source.

The sampling and holding means as defined in claim 8, may be any suitable sample and hold circuit. This allows the effect of variations of the input signal over the sampling period to be reduced.

The construction defined in claim 9 allows the ADC to be used to convert multiple channels simultaneously. The DLL or ring oscillator is shared between the channels and therefore the implementation is simplified because only one DLL or ring oscillator is required for all channels.

According to a third aspect of the invention, there is provided a method of converting an analog input signal to a digital output signal, using a delay locked loop comprising a delay line comprising a plurality of delay cells, the method comprising:

synchronizing the delay locked loop to a reference clock signal having a frequency equal to or higher than a sampling frequency;

timing an integration of a first signal to produce a timing measurement, wherein the timing measurement is at least partially determined from a logical state of the plurality of delay cells; and converting the timing measurement into the digital output signal.

According to a fourth aspect of the invention, there is provided a method of converting an analog input signal to a digital output signal using a ring oscillator comprising a delay line comprising a plurality of delay cells, wherein the ring oscillator is for generating an oscillation signal having an oscillation frequency equal to or greater than a sampling frequency, the method comprising:

calibrating the oscillation frequency of the ring oscillator with a sampling frequency or a reference frequency to produce a calibration measurement by measuring the number of delay cells through which an edge of the oscillation signal passes in a sampling period;

timing an integration of a first signal to produce a timing measurement, wherein the timing measurement is at least partially determined from a logical state of the plurality of delay cells; and converting the timing measurement and the calibration measurement into the digital output signal.

Embodiments of the invention will now be described by way of example only with reference to the accompanying drawings, in which.

Like reference numerals are used for like parts throughout the drawings and embodiments.

Figure 1:
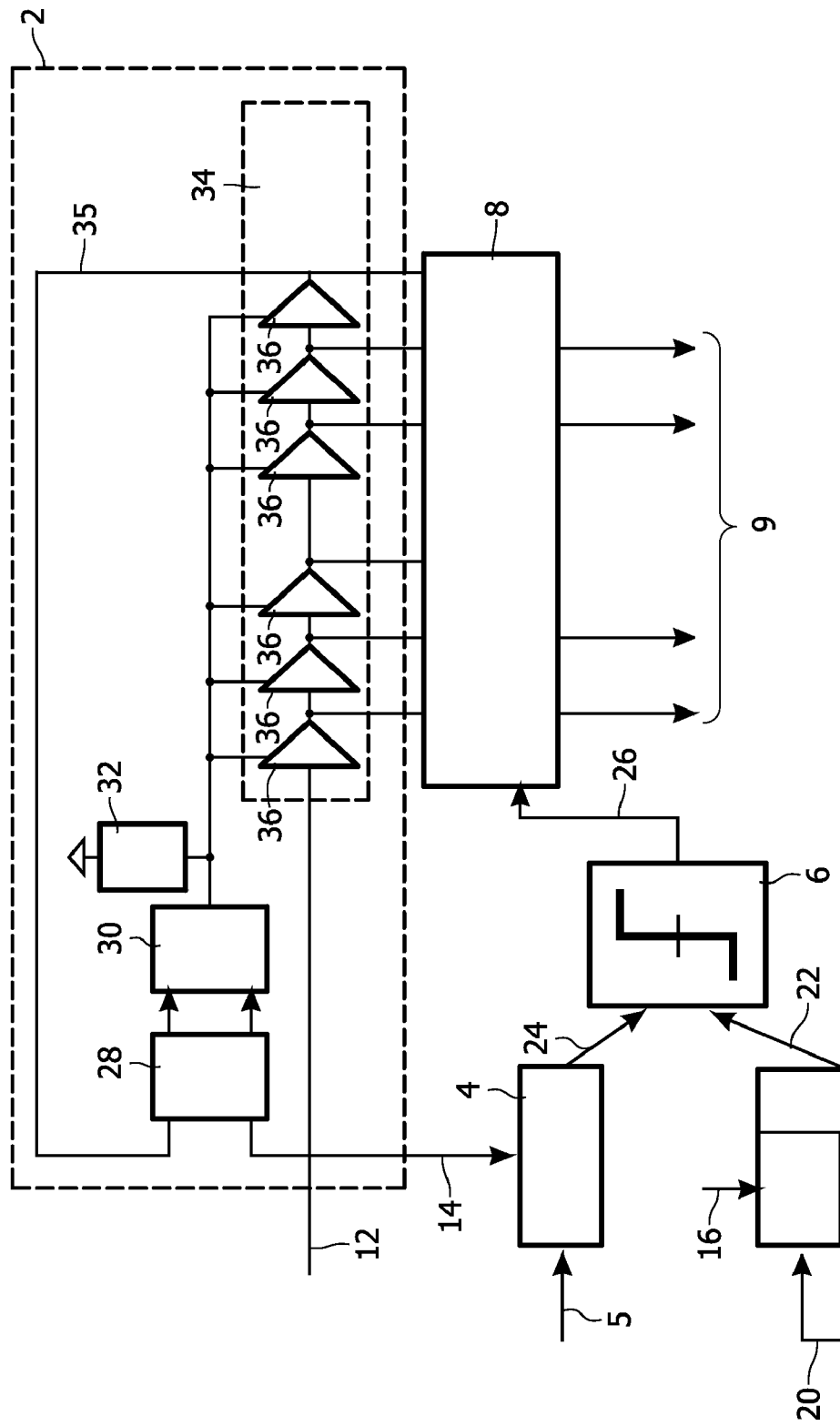
FIG. 1 is a block diagram of a first embodiment of an ADC according to the present invention.

FIG. 1 depicts a block diagram of an ADC according to a first embodiment of the present invention. The ADC comprises a DLL 2, an integrator 4, a comparator 6, a digital logic circuit 8 and a sample and hold block 10.

A reference clock source (not illustrated), which is a PLL in this embodiment but may also be implemented by other means such as a crystal oscillator, generates a reference clock signal which has a frequency of $f_s=1/T_s$, where $f_s$ is the sampling frequency and $T_s$ is the sampling period. For 180 nm CMOS process, a typical sampling frequency is 250 MHz with a resolution of 7 or 8 bits. However, the speed can be increased with technology scaling. The reference clock signal is connected to the input 12 of the DLL 2 and is also connected to a reset input 14 of the integrator 4 and to control input 18 of the sample and hold block 10. The inverse of the reference clock signal is supplied to control input 16 of the sample and hold block 10.

The analog input signal to be converted into a digital signal is connected to the input 20 of the sample and hold block 10. The output 22 of the sample and hold block 10 therefore represents the value of the analog signal at the start of each clock cycle. The sample and hold block 10 comprises two sample and hold blocks and an associated multiplexer. One sample and hold block is triggered by the reference clock signal and the other sample and hold block is triggered by the inverse of the reference clock signal. Using these two interleaved sample and hold blocks together with a multiplexer relaxes the timing issues on each sample and hold block.

The comparator 6 comprises a first input connected to the output 22 of the sample and hold block 10, and a second input connected to the output 24 of the integrator 4. An output 26 of the comparator 6 is high when the comparator determines that the signals applied to the first and second inputs are equal. The output 26 of the comparator is connected to the digital logic circuit 8.

The comparator 6 will have a finite amplitude resolution and a propagation delay. Acceptable amplitude resolution can be achieved with standard comparator designs known in the art. However, the propagation delay will result in an offset or DC shift in the digital value. If this is larger than one least significant bit of the output of the ADC compensation is required. The compensation can be either analog or digital post compensation.

The integrator 4 comprises an input that is connected to a reference voltage or current source 5. The integrator 4 is preferably a fully differential integrator with a reset input. One suitable integrator, which can operate at speeds greater than 1.7 GHz, is described in "A CMOS Interface Circuit for Detection of 1.2 Gb/s", J. Savoj & B. Razavi, *International Conference of Solid-State Circuits, ISSCC*, page 2, February 1999. A time constant tuning scheme, for example at start up of the ADC, may also be used if required.

The DLL 2 comprises a phase detector 28, a Charge Pump 30 connected to the phase detector 28, a loop filter 32 connected to the charge pump 30, and a Voltage Controlled Delay Line (VCDL) 34. The VCDL 34 comprises N individual delay cells 36. The input to the VCDL 34 is connected to the reference clock signal 12 and output of the VDCL 34 is connected to one input the phase detector 28. The reference clock signal 12 is connected to the other input of the phase detector. The action of the phase detector 28 together with the loop filter 32 forces the VCDL 34 to increase or decrease the phase. When the phases are equal, the DLL is locked.

Assuming an ideal case when all the delay cells 36 are identical, then when the DLL is locked, the delay $\tau$ of each of the delay elements in the delay line is $T_s/N$. Therefore, the propagation of the reference clock signal through the VCDL represents a timing measurement.

In this embodiment the delay cells 36 are fast slewing (short rise and fall time) and have full switching capability to minimize phase noise. It is preferred to use current-starved inverters as the basis for the delay cell. Current-starved inverters are advantageous as they do not require a level conversion circuit and this reduces the chip area and power requirements for their implementation (differential delay cells require a level conversation circuit). Pseudo-differential current-starved inverters may also be used to reduce the influence of substrate and supply noise. However, in that case the maximum operation speed of the delay cell is reduced because of the additional loading. Another advantage of using current-starved inverters (or pseudo-differential current-starved inverters) is that their full signal swing reduces jitter sensitivity.

The VCDL 34 is preferably a shifted averaging VCDL. This improves the timing accuracy of the DLL and results in an improved monotony of the output from the ADC.

The bandwidth of the DLL 2 is preferably optimized to the known, fixed reference clock signal. This can minimize clock jitter. The choice of loop filter 32 can also minimize high frequency jitter.

The Phase Detector 28 preferably employs dead zone compensation. An additional delay in the phase detector 28 ensures that each current source in the charge pump 30 is turned on for the minimum amount of time necessary. This compensates for any charge pump dead zone problems.

The digital logic 8 comprises a plurality of inputs that are connected to the output of the comparator 26 and each delay cell 36 in the VCDL 34. In response to the output of the comparator 26, the digital logic circuit 8 outputs a code representing a timing measurement by reading the state of each of the delay cell 36.

Figure 2:
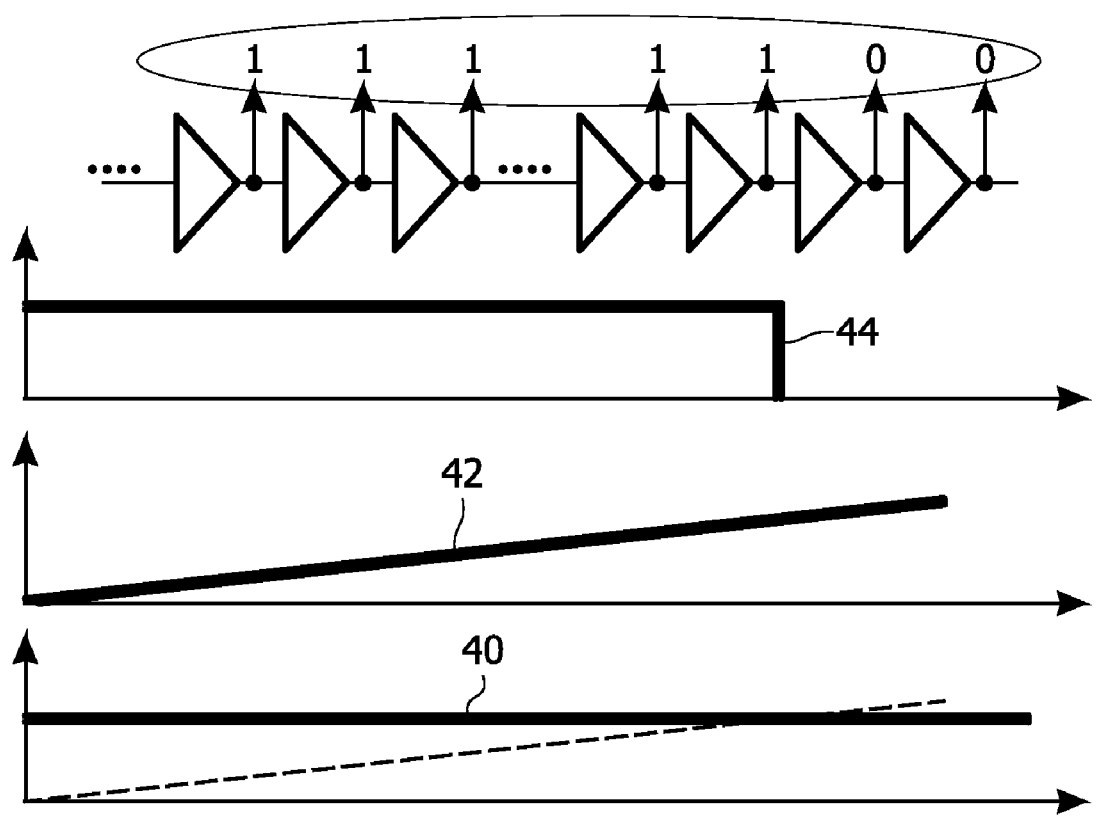
FIG. 2 is a diagrammatic representation of the use of a DLL for a timing measurement in the first embodiment of the present invention.

The operation of the ADC will now be described with reference to FIG. 2. FIG. 2 depicts the output 40 of the sample and hold circuit 10 and the output 42 of the integrator 4. The signal 44 depicts the internal clock period within the DLL against time.

Once the DLL 2 is locked to the reference clock signal, a rising edge of the reference clock signal will propagate along the delay line throughout the sample period $T_s$. The time taken for the rising edge to travel the full length of the delay line is equal to the sample period $T_s$. The rising edge of the reference clock signal also resets the integrator 4 to zero and activates the sample and hold circuit 10 to sample and hold the current value of the analog input signal.

The integrator integrates the reference current or voltage with a predetermined gradient, or slope. The slope is chosen to ensure that the integrator reaches the maximum input voltage of the ADC within a sample period. Therefore the gradient=$f_s \times (V_{in,max} - V_{in,min})$ where $V_{in,max}$ and $V_{in,min}$ are respectively the maximum and minimum values which the ADC can resolve.

During the integration of the reference voltage or current by the integrator 4, the comparator compares the output of the integrator with the output of the sample and hold circuit 10 continuously. When the output of the integrator is equal to the output of the sample and hold circuit, the comparator triggers. The output of the comparator switched from low to high.

At this point, the digital logic circuit 8 is triggered in response to the high output from the comparator. The time taken for the output of the integrator to equal the sampled and held value of the analog input signal is represented by the position of the rising edge within the VCDL 34. The position of the rising edge can be determined because the delay cells behind the rising edge will have a high signal and the delay cells ahead of the rising edge will have a low signal. The digital logic circuit 8 reads the state of each delay element and outputs a digital "thermometer" code 9 representing a timing measurement of the analog input signal. A digital thermometer code is so called by analogy with a mercury thermometer because it consists of a contiguous block of bits with a logical value of "1" followed by a contiguous block of bits with a logical value of "0". This code represents the sampled analog input signal and can be converted into a binary code by additional digital logic.

The number of delay cells 36 determines the resolution of the sampled signal. In general, if an output having a resolution of n bits is required, it is necessary to distinguish between $2^n$ signal levels and therefore $2^n$ delay cells are required. To give a numerical example, for a 5-bit resolution $2^5=32$ delay cells are required.

The internal frequency of the DLL 2 will depend on the sampling frequency $f_s$. It is independent of the resolution. The number of delay cells 36 determines the resolution.

Figure 3:
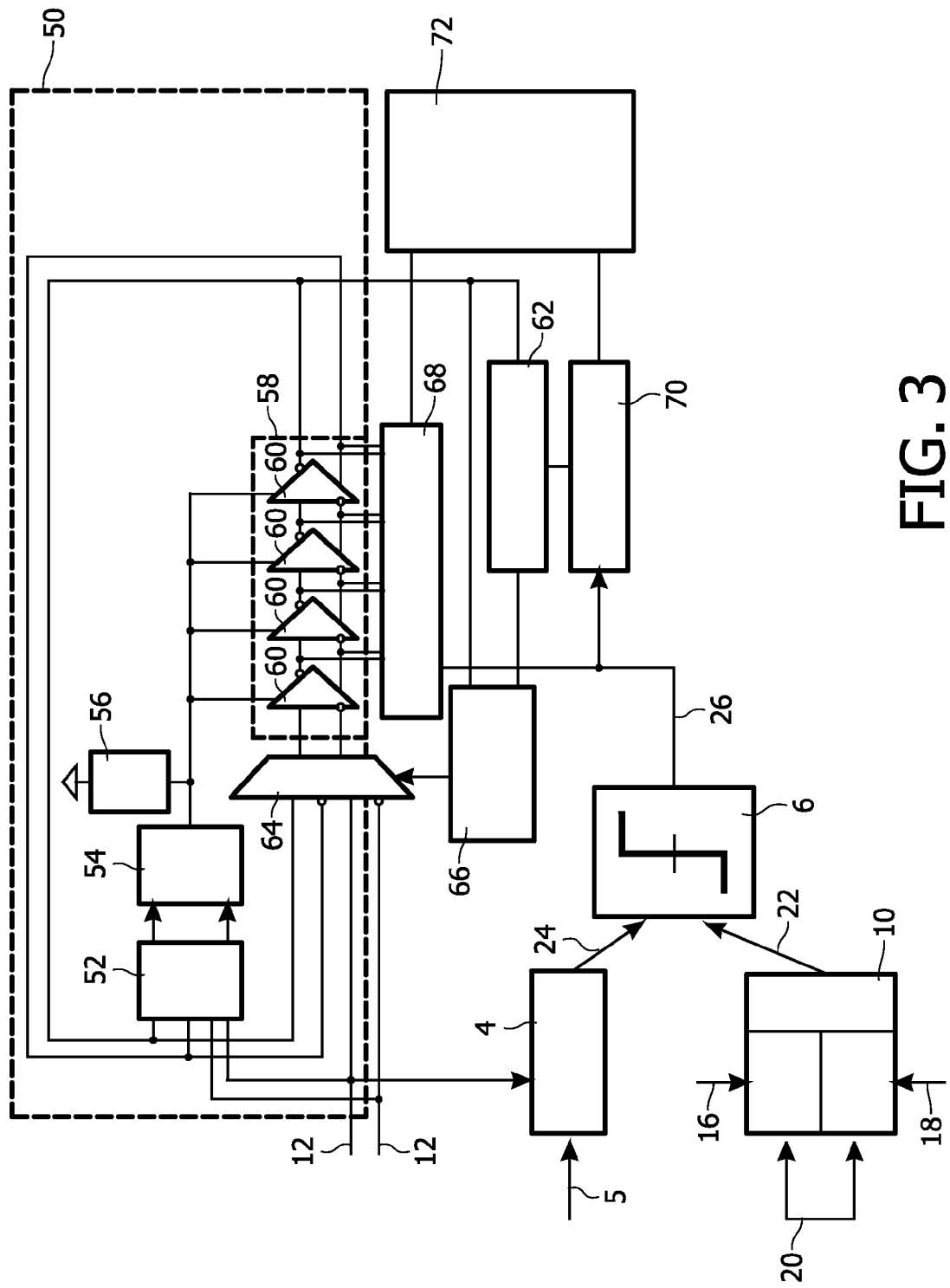
FIG. 3 is a block diagram of a second embodiment of an ADC according to the present invention.

A block diagram of second embodiment of the present invention is depicted in FIG. 3. The embodiment is the same as the first embodiment, save as described below. This embodiment uses a multiplying DLL (MDLL) 50, which has an input 12 of the reference clock signal. The operation and construction of the MDLL are, for example, as described in "A Low-Power Multiplying DLL for Low-Jitter Megahertz Clock Generation in Highly Integrated Digital Chips" by Ramin Farad-Raj et.al, published in the Journal Solid-State Circuits, Vol. 37, Nr. 12, December 2002. As with the DLL 2 of the first embodiment, the MDLL 50 comprises a phase detector, 52, a charge pump 54, a loop filter 56 and a delay line 58 comprising individual delay cells 60. In a general case K delay cells 60 are provided, in this embodiment K=4, although the number may be varied depending on the particular application. The MDLL 50 further comprises an N-divider, a multiplexer 64, and selection logic 66.

In operation, the MDLL generates an output clock signal having a frequency N times higher than the input reference clock. A ring oscillator circuit, which is formed by the feedback configuration of the delay cells 60 to the multiplexer 64, generates a clock signal depending on the voltage $V_{control}$ applied to the delay cells 60. The input to the oscillator is determined by the multiplexer 64 that has inputs of the reference clock signal 12 and the feedback signal of the last delay cell 60 in the delay line 58.

The selection logic 66 and the divider 62 count the number of edges of the output signal of the VCDL 58. After a certain number of edges have been detected, in this case N edges (as determined by the N divider), the multiplexer 64 selects the reference clock instead of the feedback clock from the last delay cell 60 of the delay line 58. In this way the multiplexer switches the ring oscillator between operation as a Voltage Controlled Oscillator (VCO) and as a VCDL while the multiplexer also injects the reference clock signal into the loop. If the generated internal clock signal is too fast, the loop via the phase detector 52, charge pump 54 and loop filter 56 acts to decrease the internal clock frequency by decreasing $V_{control}$. Similarly, if the generated internal clock signal is too slow, the loop via the phase detector 52, charge pump 54 and loop filter 56 acts to increase the internal clock frequency by increasing $V_{control}$.

When the MDLL 50 is locked to the reference clock 12, the internal clock frequency is N times higher than the reference clock.

The injection of the reference clock reduces jitter accumulation compared to the use of a Phase Locked Loop (PLL). In a PLL the jitter accumulation takes place for N cycles and this is also filtered by the PLL filter which typically will have a low bandwidth.

Figure 4:
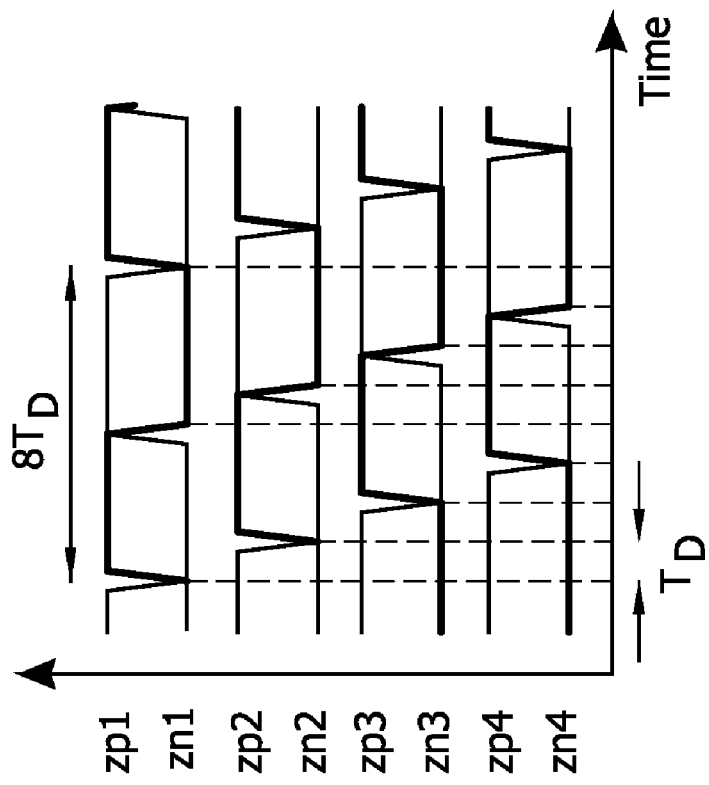
FIG. 4 is a timing diagram illustrating the phase shift of a multiplying DLL.

In the first embodiment, it was possible to determine the timing measurement by reading the states of the individual delay cells. However, in the second embodiment the operation of the MDLL 50 requires some additional steps to determine the timing measurement. The N divider 62 can provide digitized data of the timing reference with a resolution of $\log_2 N$. Furthermore, the delay line 58 comprises K delay cells (in this case K=4). By reading the state of each individual delay cell it is possible to digitize a resolution of $\log_2(2 \times K)$. This results from the fact that a DLL in feedback configuration forms an oscillator that has a phase shift of only $\pi$. The phase shift is shown in the FIG. 4 which illustrates a timing diagram of a multiplying DLL.

The digital logic circuit, or encoding circuit, 72 outputs the digital value of the analog input signal based on the timing measurement from the MDLL 50. The least significant bits of the timing measurement are determined by the state of the delay cells 60 (which is contained in a first register 68) and the most significant bits are determined by the output of the divider 62 (which is contained in a second register 70). By combining the contents of the first and second registers 68, 70, it is possible to achieve a resolution of $\log_2(2 \times K \times N)$ This enables the internal frequency of the delay cells 60 within the delay line 58 to be reduced. For example, if a 5-bit resolution is required and four delay cells 60 are used (as depicted in FIG. 3), then K=4, and to achieve an output resolution of 5-bits we require a divider with a factor of:

$$2 \times K \times N = 2^5 = 32 \Rightarrow N = 4$$

The internal frequency of the individual delay cells 60 is only 1 GHz when the MDLL is locked and producing 5-bit resolution samples at a rate of 250 MHz. In comparison, a standard integrating ADC using a counter would require an internal frequency of the counter of 8 GHz to produce an output with the same 5-bit resolution at the same rate of 250 MHz.

The second embodiment therefore provides the advantage of a reduced internal clock frequency while at the same time reducing the effects of clock jitter accumulation for the same ADC resolution and sampling rate. There is also reduced jitter as fewer delay cells are required which leads to less circuit noise. The MDLL is also less bulky than a standard DLL and can therefore be implemented with less hardware effort.

Although the first and second embodiments have been described with reference to a DLL which is locked to a reference clock equal to the sampling frequency, in alternate embodiments the DLL may be locked to any frequency that is higher than the sampling frequency. In that case the timing measurement is obtained by taking a first measurement of the state of the delay cells at the start of a sampling period and a second measurement of the state of the delay cells triggered by the comparator. The timing of the integration can then be determined by the difference between the two measurements. This has the advantage that the DLL can be optimized for operation at a single frequency, improving its performance while still allowing the ADC to operate at different sampling frequencies, independent of the frequency of the DLL.

In a third embodiment (not illustrated), which is identical to either the first or the second embodiment save as described below, the DLL is replaced with a multi-stage ring oscillator. The delay line is contained within the ring oscillator and the ring oscillator has an oscillation frequency that is equal to or greater than the sampling frequency. In this embodiment, because the ring oscillator is not locked to a reference frequency it is necessary to include a calibration unit to compensate for any variations due to temperature, process, etc.

The calibration unit is supplied with a sampling clock signal having a frequency equal to the sampling frequency. At the start of each sampling period the calibration unit measures the state of the delay cells in the delay line. By comparing the measurement at the start of the sampling period with the measurement at the start of the next sampling period the calibration unit determines the number of delay cells through which the rising edge of the oscillation signal passes in each sampling period. This is the full scale of the ADC corresponding to the voltage that the integrator reaches within on sampling period.

The calibration unit may operate for every sample or may alternatively operate for less than every sample. For example, the calibration unit may only operate when the ADC is first switched on. In the case that the calibration unit does not operate for every sample, the last obtained calibration value is used. In general, carrying out the calibration only once, for example at start up, will lead to reduced accuracy due to temperature effects.

The accuracy can be improved by averaging several measurements taken by the calibration unit. This will reduce the effect of noise on the calibration measurements.

In an alternative construction of the third embodiment, a known free-running reference clock is used by the calibration unit to calibrate the ring oscillator, rather than the sampling clock. In this alternative construction the voltage reached by the integrator after one reference clock period is determined by the calibration unit. The time that elapses during a sampling period until the comparator triggers a second measurement of the state of the delay cells can be converted into a digital value in relation to the reference clock period.

In this embodiment, the ring oscillator is not locked to the sample clock and therefore the timing measurement will require a first measurement of the state of the delay cells at the start of a sampling period and a second measurement of the state of the delay cells triggered by the comparator. The difference between the first and second measurements can then be divided in the digital domain by the full scale measurement (or by the reference measurement in the alternative construction) from the calibration unit to give the output signal.

In a fourth embodiment (not illustrated), which is identical to any one of the first to third embodiments save as described below, the ADC is adapted for use with multi-channel applications where each channel requires an ADC of the same accuracy. In this embodiment the DLL 2, MDLL 50 or ring oscillator is shared between all channels. Each channel has it's own integrator, comparator, optional sample and hold circuit and digital logic circuit. However, only a single DLL 2, MDLL 50, or ring oscillator is required, reducing the cost of implementation for multi-channel applications.

In a fifth embodiment (not illustrated), which is the same as any one of the first to third embodiments save as described below, a two stage integration process is used, rather than the single stage integration process of the first and second embodiment. In the fifth embodiment a comparator is not required. In the first stage, the integrator 2 integrates a signal that is proportional to the input voltage for a fixed period of time, preferably the entire reference clock signal period, $T_s$. In the second stage, the integrator is then discharged with a known reference signal and the time taken to discharge, $T_{dis}$ is measured using the propagation of the reference clock signal through the Delay line as in the first and second embodiments. In this embodiment, the ratio $T_s/T_{dis}$ multiplied by the reference signal corresponds to the input signal.

The fifth embodiment therefore operates at half the maximum operation speed of the first and second embodiments. However, the advantage of the fifth embodiment is that any problems arising from time constant mismatch of the integrator are eliminated. The propagation delay and offset resulting from the comparator are also eliminated.

In a sixth embodiment (not illustrated) which is the same as any one of the first to fifth embodiments save as described below, a multi-stage process is used to convert the analogue input signal into a digital signal. In this embodiment, a number of sampling clock periods may be used to improve the resolution of the sampled signal. In a first sampling clock period an initial coarse digital value of the signal is obtained using a method as described above for the other embodiments of the invention. This coarse value is then converted to an analog signal and subtracted from the input signal. The result is then amplified and supplied to the ADC as an input for a second sampling period. The value obtained for the second sampling period is used to refine the coarse value previously obtained to give a value with a higher resolution.

It will be appreciated the sixth embodiment may include more than two stages if required. Each additional stage will further increase the resolution of the output.

In a seventh embodiment (not illustrated) which is the same as any of the first to fifth embodiments save as described below, a single sample and hold block is provided rather than two interleaved sample and hold blocks and an associated multiplexer.

In further alternate embodiments, the sample and hold block is omitted and the analog input signal is used directly. However, in this case the accuracy of the ADC is reduced.

All of the embodiments use a digital delay line comprising a plurality of delay cells to take a timing measurement based on the logical state of the individual delay cells. If the delay line is part of a delay locked loop, the action of the delay locked loop automatically compensates for temperature and process variations. If the delay line is part of a ring oscillator, the frequency of the ring oscillator can be calibrated with the sampling frequency simply by measuring the number of delay cells through which an edge of the oscillation signal passes in each sampling period. The present invention therefore provides an ADC that, by using a delay line for a timing measurement, can overcome the difficulties associated with process and temperature variation in the performance of the ADC.

Throughout this specification, "comprises" is used to indicate an inclusive definition that does not exclude the presence of other components.

Where logical values are referred to, a reference "high" is a reference to a logical value of "1" and "low" is a reference to a logical value of "0". It will be appreciated that the invention can also be operated with the inverse of all the values stated, i.e. with the values of "high" and "low" transposed. Equally, although the above described embodiments have referred to the use of a rising edge of a clock signal, the invention can also be implemented using a falling edge of a clock signal.

It will be appreciated that the invention could be implemented with discrete components, as described, or integrated so that some or all of the components are contained in a single integrated circuit.

The invention claimed is:

1. An integrating analog to digital converter (ADC) for converting an analog input signal into a digital output signal, the integrating ADC comprising:
    signal generation circuitry for generating a reference clock signal having a frequency equal to or greater than a sampling frequency;
    a multiplying delay locked loop (MDLL) including a delay line comprising a plurality of delay cells wherein the delay locked loop is locked to the reference clock signal;
    integration circuitry for integrating a first signal; and
    digital logic circuitry for generating the digital output signal from a timing measurement of an integration carried out by the integration circuitry, and wherein the timing measurement is at least partially determined from the logical state of the plurality of delay cells.

2. An integrating ADC according to claim 1 wherein the reference clock signal has a frequency equal to the sampling frequency.

3. An integrating ADC according to claim 1, wherein the timing measurement is entirely determined from the logical state of the plurality of delay cells.

4. An integrating ADC according to claim 1, wherein the MDLL further includes dividing circuitry for dividing the output from the delay line, and wherein the timing measurement is determined from the logical state of the plurality of delay cells and the output of the dividing circuitry.

5. An integrating analog to digital converter (ADC) for converting an analog input signal into a digital output signal, the integrating ADC comprising:
    signal generation circuitry for generating a sampling clock signal having a sampling frequency;
    a ring oscillator including a delay line comprising a plurality of delay cells, and for generating an oscillation signal having an oscillation frequency equal to or greater than the sampling frequency;
    integration circuitry for integrating a first signal;
    calibration circuitry for calibrating the oscillation frequency of the ring oscillator with the sampling frequency or a reference frequency by determining the number of delay cells through which an edge of the oscillation signal passes in a sampling period; and
    digital logic circuitry for generating the digital output signal from a timing measurement of an integration carried out by the integration circuitry, and wherein the timing measurement is at least partially determined from the logical state of the plurality of delay cells.

6. An integrating ADC according to claim 1, further comprising:
    comparison circuitry, for comparing the output of the integration means with a second signal and for outputting a signal when the output of the integration circuitry is equal to the second signal;
    and wherein the timing measurement is taken in response to the signal from the comparison means.

7. An integrating ADC according to claim 6, wherein the second signal is the analog input signal and the first signal is a reference voltage or current source.

8. An integrating ADC according to claim 6, further comprising sampling and holding circuitry, for sampling and holding a value of the analog input signal responsive to the reference clock signal or the sampling clock signal, and wherein the second signal is the output of the sampling and holding circuitry and the first signal is a reference voltage or current source.

9. An integrating ADC according to claim 1, for converting analog input signals from two or more channels into corresponding digital output signals, wherein the integrating ADC further comprises:
- one integration circuit for each of the second and subsequent channels; and
- one digital logic circuit for each of the second and subsequent channels;
- wherein one delay locked loop or one ring oscillator is shared by the two or more channels and wherein a timing measurement for each channel is at least partially determined from the logical state of the plurality of delay cells.

10. A method of converting an analog input signal to a digital output signal, using a multiplying delay locked loop (MDLL) having a delay line with a plurality of delay cells, the method comprising:
- synchronizing the delay locked loop to a reference clock signal having a frequency equal to or higher than a sampling frequency;
- timing an integration of a first signal to produce a timing measurement, wherein the timing measurement is at least partially determined from a logical state of the plurality of delay cells; and
- converting the timing measurement into the digital output signal.

11. A method according to claim 10, wherein the MDLL further includes dividing circuitry for dividing the output from the delay line, and wherein in the step of timing an integration of a first signal, the timing measurement is determined from the logical state of the plurality of delay cells and the output of the dividing circuitry.

12. A method of converting an analog input signal to a digital output signal using a ring oscillator includes a delay line with a plurality of delay cells, wherein the ring oscillator is for generating an oscillation signal having an oscillation frequency equal to or greater than a sampling frequency, the method comprising:
- calibrating the oscillation frequency of the ring oscillator with a sampling frequency or a reference frequency to produce a calibration measurement by measuring the number of delay cells through which an edge of the oscillation signal passes in a sampling period;
- timing an integration of a first signal to produce a timing measurement, wherein the timing measurement is at least partially determined from a logical state of the plurality of delay cells; and
- converting the timing measurement and the calibration measurement into the digital output signal.

13. A method according to claim 1, the method further comprising the step of:
- comparing the result the integration of the first signal with a second signal;
- and wherein the timing measurement is taken when first signal is equal to the second signal.

14. A method according to claim 13, wherein the second signal is the analog input signal and the first signal is a reference voltage or current source.

15. A method according to claim 13, further comprising the step of:
- sampling and holding a value of the analog input signal at the start of said step of timing an integration;
- and wherein in the step of comparing, the second signal is the value obtained in the step of sampling and holding and the first signal is a reference voltage or current source.

* * * * *